United States Patent
Kadah et al.

(10) Patent No.: US 10,267,532 B2
(45) Date of Patent: Apr. 23, 2019

(54) THERMOSTAT WITH POWER STEALING

(71) Applicants: Eric Christopher Wood, East Syracuse, NY (US); Andrew S. Kadah, Manlius, NY (US); Michael James Cariseo, Syracuse, NY (US)

(72) Inventors: Hassan B. Kadah, Marco Island, FL (US); Eric Christopher Wood, East Syracuse, NY (US); Andrew S. Kadah, Manlius, NY (US); Michael James Cariseo, Syracuse, NY (US)

(73) Assignee: International Controls and Measurements Corporation, North Syracuse, NY (US)

( * ) Notice: Subject to any disclaimer, the term of this patent is extended or adjusted under 35 U.S.C. 154(b) by 256 days.

(21) Appl. No.: 15/338,659

(22) Filed: Oct. 31, 2016

(65) Prior Publication Data
US 2018/0119976 A1  May 3, 2018

(51) Int. Cl.
| | |
|---|---|
| H03K 17/61 | (2006.01) |
| H03K 17/74 | (2006.01) |
| H03K 17/691 | (2006.01) |
| F24F 11/02 | (2006.01) |
| G05D 23/19 | (2006.01) |
| F24F 11/89 | (2018.01) |

(52) U.S. Cl.
CPC ............ *F24F 11/89* (2018.01); *G05D 23/19* (2013.01); *H03K 17/61* (2013.01); *H03K 17/691* (2013.01); *H03K 17/74* (2013.01)

(58) Field of Classification Search
CPC ....... F24F 11/89; G05D 23/19; H03K 17/691; H03K 17/61; H03K 17/74
See application file for complete search history.

(56) References Cited

U.S. PATENT DOCUMENTS

| | | |
|---|---|---|
| 5,272,427 A | 12/1993 | Nold et al. |
| 7,476,988 B2 | 1/2009 | Mulhouse et al. |
| 8,093,858 B1 * | 1/2012 | Kadah ...................... H02P 1/42 318/786 |
| 8,110,945 B2 | 2/2012 | Simard et al. |
| 8,770,491 B2 | 7/2014 | Warren et al. |
| 2014/0368036 A1 | 12/2014 | Houde et al. |
| 2015/0002165 A1 | 1/2015 | Juntunen et al. |

* cited by examiner

*Primary Examiner* — Jared Fureman
*Assistant Examiner* — Michael J Warmflash
(74) *Attorney, Agent, or Firm* — Bernhard P. Molldrem, Jr.

(57) ABSTRACT

A thermostat or other in-line, two-conductor control device employs a power-stealing technique to obtain DC power for its electronic controls where the thermostat wire run has an R wire but no C (common) wire. The controlled switch for a reactive load, such as the gas valve relay or compressor contactor, is formed of a pair of power capacitors and a pair of switching transistors or other electronic controlled switches. The conductors for feeding DC power to control electronics are connected with the junctions of the power capacitors and their respective switching transistors. The power capacitors and switching transistors can be configured in respective series combinations, with the series combinations forming a parallel combination. The control device can be considered to have an energy storage and switching arrangement that forms with the load an L-C circuit and an electronic switch in circuit between the energy storage arrangement and the load and can be switched on and off to provide an input to a DC power supply.

28 Claims, 4 Drawing Sheets

THERMOSTAT WITH POWER STEALING

BACKGROUND OF THE INVENTION

The present invention relates to residential heating and/or cooling systems and other indoor comfort systems, and is more particularly concerned with thermostats of the type that derive the power for monitoring conditions within the comfort space and for controlling the signaling to the furnace or other comfort system from a source of thermostat power, e.g., 24 volts AC. The invention is more specifically directed to in-line controller devices which may have connection to only one end of an AC source, an example of which is a thermostat that can be used when the run of thermostat wires between the thermostat and the furnace does not include a common or C wire, and must derive its DC or battery power from the thermostat power or R wire. In that case, the associated heating apparatus may include a gas furnace, oil furnace, or electric furnace or heat pump, and cooling may be provided from a compression/condensation/expansion/evaporation cycle air conditioner, an absorption type air conditioner, a ground-water heat exchange cooling system, or other available chilling apparatus. The term "cooling" includes both sensible cooling (reducing the temperature of the comfort air) and latent cooling (removing humidity). These comfort air apparatus may have additional functions for better control of the environmental air in the comfort space, such as multiple fan speeds, high and low heating, and high and low compressor speeds, or staged capacity, and exchange of outdoor air and indoor air.

Thermostats are typically installed on an interior wall of a dwelling, business space or other residential or commercial space to control the operation of a furnace, air conditioner, heat pump, or other environmental control equipment. The thermostat continuously monitors the temperature of the room or other interior comfort space or zone, and is connected by a run of thermostat wires to the associated environmental control equipment to signal a call for heating, a call for cooling, or otherwise to keep an interior comfort space parameter, such as temperature, within some range (e.g., 68° F., ±1.0° F.). Other controls may be available, sensitive to other parameters, such as humidity or particulate level.

Older residences and other buildings had at one time used thermostats with electro-mechanical (e.g., bimetal or mercury) controls to turn the furnace and/or air conditioner on when heating or cooling was needed. Since the thermostat did not include any electrically powered control functions, the thermostat wire run between the thermostat and the HVAC equipment only needed a single thermostat power wire or R wire from one side of the thermostat transformer secondary coil, and control wires going from the thermostat to the furnace and/or air conditioner, i.e., a W wire for heat, a Y wire for air conditioning, and a G wire for fan or blower-only. The controlled elements in the furnace, e.g., gas valve relay, air conditioner compressor contactor, or fan relay, complete the circuit to the other side or return side of the thermostat transformer secondary. In more modern installations, the thermostat wire run may also include a common or C wire (usually with black or blue insulation) which connects to the return side of the thermostat transformer, so that 24 volts AC is available at the thermostat. Most modern thermostats include electronic controls that require some source of DC power. Where the thermostat wire run includes both an R wire and a C wire, then thermostat power is constantly available and can be converted to the correct level of direct current to power the thermostat. In older installations where there is no C wire, battery-powered thermostats can be employed with the DC power for the internal electronics being supplied by one, two or three power cells in the thermostat. The battery-powered thermostat is constantly drawing power from the battery supply, and after some period of time, typically about one year, the power cells become depleted and need to be replaced with fresh power cells. This is something that many homeowners and many other building occupants fail to check on and often the thermostat fails to send a call for heating or cooling to the HVAC equipment because there is insufficient battery power available in the thermostat.

In order to avoid the need for battery power for thermostats in installations where there is no C or common wire in the thermostat wire run, and there is only the single direct wire (i.e., the R wire) to the thermostat transformer, a number of thermostats have been proposed that employ a "power stealing" or "power sharing" technique to obtain DC power for the thermostat electronic controls. These thermostats direct a portion of the thermostat power (i.e., stealing, sharing, or harvesting the thermostat power) to a rectifier to use for the power for the electronic controls. That is, a small amount of current directed around the controlled switch device, i.e., triac, MOSFET, IgbT transistor, etc, to connect the R wire with the W or Y wire when there is a call for heat or cooling, but to open that connection when the call for heat or cooling is satisfied. This re-directed current, which has to be at a low level, is allowed to flow to the DC power converter and then to the W or Y wire. The current has to be small so that the current will not actuate the associated gas valve or compressor contactor. This shared power then keeps a rechargeable battery (or high-value capacitor) charged sufficiently to provide the required energy to the thermostat controls. The redirected thermostat current is available only when there is no call for heat (or cooling). In order to help power the thermostat when there is a call for heat or cooling, the power-stealing thermostat may also place a small voltage drop in line with the W or Y wire, i.e., between the thermostat and the associated load coil (gas valve relay or compressor contactor). The voltage across this voltage-drop resistor can to provide some electrical power to the DC power supply in the thermostat when there is an ongoing call for heat or cooling, while energy is being supplied to the gas valve relay or the compressor contactor. On the one hand, the amount of current flowing to the DC supply and the load coil has to be kept small so that the coil will not energize the gas valve or compressor when there is no call for heat or cooling, even at maximum transformer voltage. On the other hand, the amount of voltage drop in line with the load coil has to be kept small so that the associated load coil will not drop out when there is an ongoing call for heat or cooling, even when there is a reduced line power situation, e.g., brownout.

Additionally, many modern thermostats are so-called intelligent thermostats including programming features, environmental control capabilities, and in many cases radio, e.g., wi-fi capability, so that the thermostat settings can be changed remotely, using a cell phone or tablet, for example, or may be configured to respond to power alerts from the local electric utility. These functionalities all require the thermostat to have a reliable source of power for the thermostat electronic controls, especially for the wi-fi or other radio system, which significantly increase the DC current draw.

In most existing installations, it is difficult and time consuming to replace the thermostat wire run with a run that includes a common or C wire. In most cases it is not feasible to apply a line-current power supply or power block at the thermostat to provide DC power.

As mentioned above, in the presently available power-stealing or power-sharing techniques, the power-stealing arrangement redirects a portion of the current around the controlled switching device, i.e., around the power electrodes of the triac, directly between the R and W or between the R and Y wires. This arrangement can result in intermittent operation and, in cases where extreme cold weather causes the furnace to run continuously for long periods, can fail to keep the internal power supply adequately charged. All the prior-art arrangements are in the form of a voltage divider between the switch element and the connected load, and so the power supply is in parallel with the switch device.

OBJECTS AND SUMMARY OF THE INVENTION

Accordingly, it is an object of the present invention to provide an improvement to a power-stealing thermostat that overcomes the above-mentioned drawback(s) of the prior art.

It is a more particular object to provide an effective means for the thermostat to obtain a steady supply of DC power for its internal electronic control arrangements, where hardwiring the thermostat is not possible due to the lack of a common or C wire, and to provide reliable DC power both when there is a call for heat (or cooling) to cycle the HVAC equipment on, and when the call for heat or cooling has been satisfied and the associated HVAC equipment is cycled off without reducing the available voltage connected to the load.

It is yet another object to provide the power-stealing thermostat such that the power-stealing arrangement will not actuate the associated load coils (e.g., gas valve relay or compressor contactor) when there is no call for heating or cooling, and also will not drop out the associated load coil for lack of sufficient thermostat power which would result from reduction in the voltage available to the load to power logic and switching.

Another object is to derive control power from a reactive switch element in series with a reactive load element, to take advantage of the phase-shifting action of the reactive switch element.

Whereas prior power-stealing power supply systems treat the thermostat current flow as if it were a DC ohmic system, it is an object of this invention to recognize that the thermostat is an AC system, and to exploit the phase relations that occur in reactive RLC networks.

It is still another object to achieve a boost of the load voltage above the applied AC thermostat voltage by employing power that is reflected from the reactive load element and which would otherwise revert back to the AC source, and by integrating that power to drive logic and control elements and/or the load itself.

In accordance with one aspect of the present invention, a thermostat is adapted to be mounted in a comfort zone within a dwelling or other space or structure, and is configured to communicate, via a run of thermostat wires, with a comfort air control unit (furnace or air conditioner, for example) that provides heated and/or conditioned air to the comfort zone. The thermostat continuously monitors the temperature of air within the comfort zone. The thermostat has a housing, electronic control circuitry within the housing and is powered by a DC power source that provides DC power sufficient to power the circuitry within the thermostat. There are one or more controlled switch arrangements within the thermostat that connect the thermostat main power wire, i.e., the R wire, to an associated control wire, i.e., W or Y wire, to supply thermostat power to a load device, e.g., gas valve relay or compressor contactor, to commence a heating cycle or a cooling cycle when there is a call for heat or call for cooling issued by the thermostat. The associated comfort air apparatus provides heated or cooled air to the comfort space when the thermostat issues a call for heat or cooling based on the temperature of air in said comfort space. The thermostat then shuts down the comfort air apparatus when the thermostat determines that the call for heat or cooling has been satisfied. The thermostat is especially configured to operate with a run of thermostat wires that has a main thermostat power wire or R wire, but lacks a direct return wire, i.e. common or C wire.

In the thermostat, a main thermostat power connector connect to a predetermined one of the thermostat wires, typically the R conductor, to receive AC thermostat power, and at least one controlled output connector of the thermostat provides switched AC thermostat power to one or more wires of the run, e.g., the W and Y wires, to cycle the comfort air apparatus when there is a call for heat or cooling and to end the cycle of said comfort air apparatus when the call for heat or cooling has been satisfied.

One or more electronic switch arrangements in the thermostat each have a main electrode coupled to the main thermostat power connector and a switched electrode connected to the respective controlled output connector (for the W wire or the Y wire) to cycle the comfort air apparatus on and to cycle the apparatus off.

An electronic thermostat control arrangement within the thermostat monitors the comfort space temperature, maintains temperature set points, progresses through thermostat program or programs and may communicate via a wi-fi, blue tooth or other wireless system to provide for remote monitoring and remote adjustments of conditions in the comfort space. This arrangement typically includes a temperature sensing element sensitive to the temperature in comfort space, and control circuitry coupled to said temperature sensing element to issue a call for heat or cooling when a predetermined temperature setpoint is reached, and to end said call for heat when said call for heat or cooling is satisfied.

A power-stealing DC power supply, as set forth just below, is coupled to the electronic switch arrangement(s) for obtaining a portion of the AC thermostat power and supplying DC power to the thermostat's electronic thermostat control arrangement.

In the thermostat according to the embodiments of the present invention, the reactive switch arrangements each are formed of first and second power capacitors each having a first electrode and a second electrode, with the first electrode of the first power capacitor and the second electrode of the second power capacitor being connected to the main thermostat power connector; first and second electronic switching devices, each having a first power electrode, a second power electrode and a gate, with the first power electrode of the first switching device and the second power electrode of the second switching device being connected to the switched electrode, and with the second electrode of the first power capacitor being connected to the second power electrode of the first switching device, and the first electrode of the second power capacitor being connected to the first power electrode of the second switching device.

The associated control circuitry includes outputs providing respective periodic gating signals to the gates of said first and second switching devices, respectively, with the gating signals having a first waveform when the thermostat control arrangement issues a call for heat or cooling, and having a second waveform when the call for heating or cooling is satisfied. The pulse width and duty cycle of the gating signals applied to the switching devices can vary as a function of input voltage and desired output waveform shape. The desired DC control power can be taken between the two power capacitors.

The DC power supply then has its two power inputs respectively coupled to the second electrode of said first power capacitor and to the first electrode of said second power capacitor. Thus the DC is not derived from a resistor that is in shunt between switch device and the load, as is conventional in other power-stealing arrangements.

The first and second electronic switching devices may each include a MOSFET power transistor and a bypass diode connected between the first power electrode and the second power electrode of the power transistor, such that the associated capacitors will charge in one direction when the switching device is gated off and both charge and discharge when the switching device is gated on. That is, the bypass diodes each have an anode connected to the first power electrode of the associated switching device and a cathode connected to the second power electrode thereof.

In a favorable implementation, the first waveform of each of the gating signal sent to the electronic switching devices has a duty cycle that is substantially greater than the duty cycle of said second waveform. These may be, for example, PWM signals to control the amount of thermostat current allowed to pass during a given cycle of the thermostat power.

The thermostat or other control device does not have to be arranged with the power capacitors connected to the R or power wire, and with the switching transistors connected with the load, e.g., with the gas valve relay. More generally, one of the first and second main electrodes of each of the first and second switching devices is connected to one of the first and second electrodes of an associated one of said first and second power capacitors, and the other of the first and second electrodes of the first and second power capacitors and the other of the first and second main electrodes of the first and second switching devices are connected in series between power or T wire and the load. The inputs for the DC power supply may then be obtained at respective junctions of the first power capacitor with the associated first switching device and of the second power capacitor with the associated second switching device.

The thermostats (or other in-line control devices) of this invention are well adapted for installations where the run of thermostat wires lacks a common or return wire for directly coupling said thermostat to a return of the AC thermostat power. The power-stealing power supply is configured to obtain AC thermostat power that is reflected at the electronic reactive switching mechanism.

Favorably, the power-stealing power supply includes charge storage means, which may be implemented as a rechargeable battery or a suitable large value capacitor, for maintaining a DC output voltage to supply the electronic thermostat control arrangement.

This invention is not limited to thermostats or to an HVAC application. Stated more broadly, the invention can apply to any in-line control device connected in series with a load device which has a load that is at least partly reactive (e.g., electric motor or electromagnetic device such as a contactor). In that case the in-line control device has a power terminal connected to one side of a source of AC power and a connector terminal connected to said load device, and the load device has a return power terminal connected to a second side of the source of AC power. In this invention, the control device has a switching arrangement connected between the power terminal and the connector terminal for switching the load device on and off and a DC powered circuit mechanism within the in-line control device for providing gating signal to said switching arrangement for commanding the switching arrangement to supply said AC power to the load device or to shut off the AC power from the load device. The switching arrangement includes an electronic switch mechanism having a main electrode coupled to the power terminal; a switched electrode connected to the connector terminal; and a gating electrode or electrodes receiving the gating signals to indicate whether to apply AC power to the reactive load and when to disconnect the AC power from the load, respectively.

The control circuitry coupled with a sensing element and supplies the gating signals of one sense to commence the supply of AC power to the load device, and to supply said gating signals of a second sense to end the supply of AC power to the load device.

To accomplish this, the electronic switching mechanism includes first and second power capacitors each having a first electrode and a second electrode, with the first electrode of the first power capacitor and the second electrode of the second power capacitor being connected to the power terminal to the one side of the AC source. The electronic switching mechanism also includes first and second electronic switching devices, each having a first power electrode, a second power electrode and a gate, with the first power electrode of the first switching device and the second power electrode of the second switching device being connected to the connector terminal and thence with the reactive load device, and with the second electrode of the first power capacitor being connected to the second power electrode of the first switching device, and the first electrode of the second power capacitor being connected to the first power electrode of the second switching device. More generally, expressed, one of the first and second main electrodes of each of the first and second switching devices would be connected to one of the first and second electrodes of an associated one of said first and second power capacitors, and the other of the first and second electrodes of the first and second power capacitors and the other of the first and second main electrodes of the first and second switching devices being connected in series between said power terminal and the load.

The DC powered control circuitry includes outputs providing respective periodic gating signals $S_1$ and $S_2$ to the gates of said first and second switching devices, respectively. These gating signals have said one sense when the sensor senses a condition for commencing a supply of AC power to said load device, and have their second sense when the sensor senses a condition for terminating the supply of AC power to the load device.

The DC powered circuit mechanism has its positive and negative power inputs connected to the second electrode of the first power capacitor and to the first power electrode of the second power capacitor, respectively, such that the power capacitors serve as a power-stealing DC supply for the DC powered circuit mechanism without interfering with the supply of AC power or the termination of supply of AC power to the load device. More generally, inputs to the DC power supply are coupled to respective junctions of the first power capacitor with the associated first switching device and of the second power capacitor with the associated second switching device.

Bypass diodes may be connected between the first power electrode and the second power electrode thereof of each of the first and second switching devices.

Stated more generally, this invention can be considered as control device for regulating application of AC power from an AC power source to a load that is at least partly reactive, and at the same time diverting at least a portion of the AC power to power a device other than the partly-reactive load. In this case, the control device can be considered to have an energy storage and switching arrangement that is at least partly reactive and is adapted to form, with the load an L-C circuit powered by the AC power when the energy storage and switching unit is connected to the load and the AC power source. An electronic switch is disposed in circuit between the energy storage arrangement and the load and is adapted for switchably connecting the energy storage and switching unit with to the AC power and the load. A gating circuit is connected to a gating input of the electronic switch and is adapted to cause the electronic switch to close and open in a time sequence relative to a waveform of the AC power, and is also adapted to generate, at a junction between the energy storage device and the electronic switch, a voltage having a value that depends on an attribute of said time sequence. A power supply has an input and an output, the input being connected to receive the voltage appearing at the junction between the energy storage device and said electronic switch, with the output being adapted to supply an altered form of that voltage to the aforesaid device other than the load. Favorably, the energy storage device comprises at least one capacitor.

In a favorable embodiment the energy storage device comprises a first capacitor and a second capacitor, and the electronic switch comprises a first switching device and a second switching device. Each such switching device has a main electrode and a switched electrode connected in series with a corresponding one of the first and second capacitors, and has a gate electrode connected to the gating circuit and controlled by respective gating signals from the gating circuit, thereby causing the first and second switching devices to permit and interrupt current flow across their main and switched electrodes. The input of the power supply may be connected to receive a differential voltage appearing between a first junction, which is between the first switching device and the first capacitor, and a second junction, which is between the second switching device and the second capacitor. The power supply can include a converter adapted to provide a direct current at its output. In this case, the input and output may each include at least two conductors. In some favorable embodiments, the first and second electronic switching devices and the first and second power capacitors being coupled to power electrodes of the respective first and second switching devices can be considered as being connected, at a respective junction therebetween, and thus defining respective serial combinations. The serial combinations are connected to each other in parallel in a parallel combination connected with the AC power and load in series.

The above and other features and advantages of the thermostat of the present invention can be appreciated from the ensuing detailed description of a preferred embodiment, which is to be read in connection with the accompanying Figures of Drawing.

BRIEF DESCRIPTION OF THE DRAWING

FIGS. 3A to 3D and 3F to 3J are waveform diagrams of input power, control signals and output levels for explaining the operation of the thermostat of this embodiment.

DETAILED DESCRIPTION OF A PREFERRED EMBODIMENT

Figure 1:
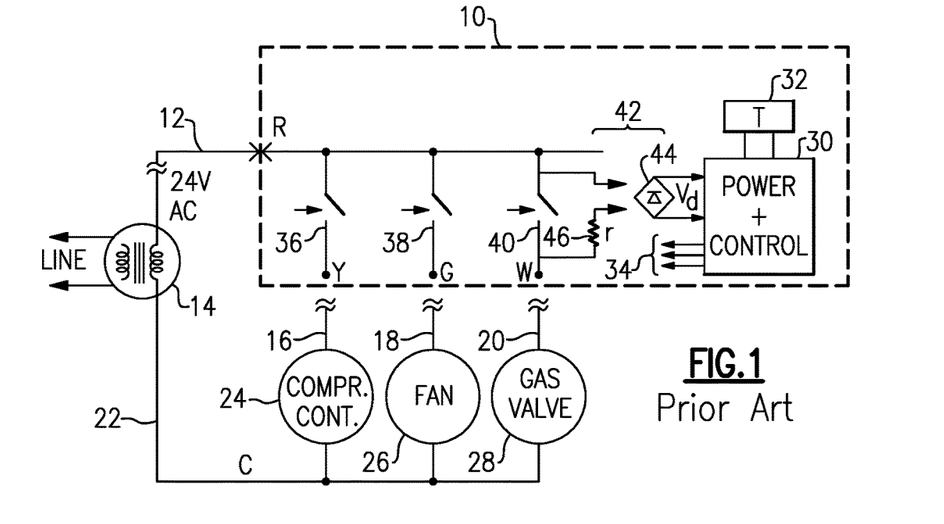
FIG. 1 is a schematic circuit diagram of a thermostat with a power-stealing power supply according to the prior art.

With reference to the Drawing, FIG. 1 helps explain the structure and operation of a power-stealing thermostat 10 according to the prior art. The thermostat 10, represented as the rectangle within broken lines, is connected to a thermostat wire run or group of thermostat wires, which includes a power or R wire 12 that carries 24 volts AC thermostat power from the secondary of a thermostat transformer 14. A cooling wire 16 connects a Y or cooling terminal with a compressor contactor 24; a fan wire 18 connects a fan terminal G with a fan relay 26; and a heating wire 20 connects a W contact with a gas valve relay 28. A common or C conductor 22 serves as a return conductor to connect the contactor 24, fan relay 26 and gas valve relay 28 to the return terminal of the secondary of the thermostat transformer 14. The common or C conductor does not reach the thermostat 10. A thermostat power and control circuit 30 is connected with a linear temperature sensor to sense the temperature in the occupied comfort space, and provides switching signals via a control signal output 34 for energizing the gas valve relay 28 or for turning on the fan 26, or energizing the compressor contactor depending on the setpoints stored in the power and control circuit 30 and the output of the temperature sensor 32.

Electronic or electro-mechanical switching devices 36, 38 and 40 are interposed in line between the power or R wire 12 and the air-conditioning or Y contact, the fan contact G, and the heat contact W, respectively. These electronic switching devices each have a first power electrode connected to the R conductor, a second power electrode connected to the respective Y, G, or W contact, and a gating electrode to which switching signals are applied from the control signal outputs 34 of the thermostat power and control circuit. Gating signals turn the respective switching devices ON when there is a call for heat or cooling or for ventilation, and this causes thermostat current to flow from the power or R wire, out through the associated load, i.e., air conditioning compressor contactor, fan relay, or gas valve relay, and thence to return to the secondary of the thermostat transformer. When the gating signal goes OFF, the circuit opens and the heating apparatus, fan, or cooling apparatus begins a shut down procedure.

In this arrangement, the common or C conductor is not included in the thermostat wire run, and does not reach the thermostat 10. Accordingly, the DC power supply of the thermostat 10 cannot be hard-wired, and the thermostat has to employ a power-diverting or power-stealing strategy to obtain power to run the electronic and control circuit 30. In a modern thermostat, the control electronics requires between about 1 milliamp and 5 milliamps depending on whether there is an active call for heating or cooling. Other components, such as an active touch screen may also require power, and a wireless, i.e., wi-fi capability requires additional current.

A power-stealing arrangement 42 here diverts current around one (or more) of the controlled switches, here switch 38, and extends from the first power electrode of the switching device, to an AC to DC converter 44, and then through a current-limiting resistor 56 to the second current carrying electrode of the controlled switch 38, so a low level of current flows through the associated load coil, e.g., gas valve relay, and then via the C conductor back to the transformer 14. The resistor has an ohmic value r selected to that there is sufficient current to the AC to DC converter to power the thermostat and charge-up any storage battery in the thermostat, but a low enough current that the gas valve relay does not actuate and does not commence a heating cycle when there is no call for heating.

This arrangement can provide the required DC power for operating the thermostat during times when there is no call for heat and when the switching devices are open. During a call for heat, the controlled switch 38 will close, and all the thermostat current then shunts through the switching device. This arrangement will affect power-stealing during these times, and so the stored charge on the internal battery will need to power the thermostat electronics until the call for heat is satisfied and the switching device opens again. During times of extreme cold weather, the furnace may need to cycle on for many hours at a time, which can allow the battery to become completely exhausted, so an alternate power-stealing technique may be used to obtain DC power during times when the furnace (or air conditioner) is cycled on. This typically involves placing a small-ohmic-value resistor (not shown here) in series between the second power electrode of the switching device and the W (or Y) terminal, so that there is a small voltage drop, and the voltage can be taken across this resistor and used to supply some DC power to the thermostat power and control circuit 30. This series resistor needs to be carefully selected so that when the switching device is closed, there is sufficient current that the gas valve relay 28 or other load coil pulls in and does not drop out, even under low line voltage conditions, but this resistor also needs a high-enough ohmic value that it creates a voltage drop sufficient to create the needed DC power. These prior-art arrangements overlook the possibility of obtaining the control voltage by capturing some of the power reflected from the AC load by controlling the phase of an electronic switch and then using the captured reflected power for the DC energy to power the control circuit and to recharge batteries. This sub-cycle opening of the switch will recharge the DC power supply, but will correspondingly reduce the available voltage to the load by creating a voltage divider.

Accordingly, prior art power-stealing thermostat designs have not been altogether satisfactory, and there has been a need for a more effective circuit design for powering the thermostat electronics where the thermostat run did not include a return or C wire.

Figure 2:
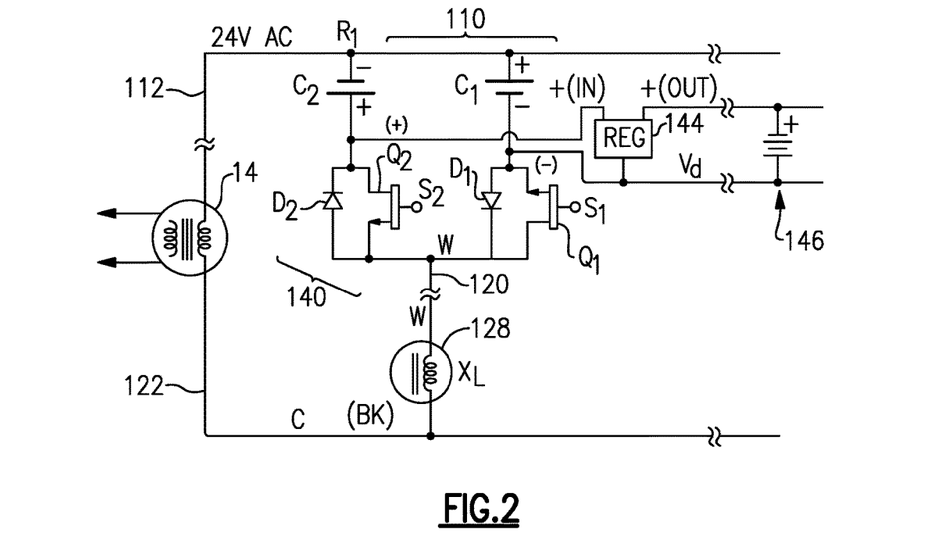
FIG. 2 is a schematic diagram of a portion of a thermostat with an improved DC power-stealing power supply arrangement according to one embodiment of the present invention.

A power-stealing thermostat according to one favorable embodiment of this invention is illustrated in FIG. 2. In this illustration, the thermostat 110 has an associated thermostat power conductor 112 or R conductor extending to it from the thermostat transformer 14, and a W terminal is connected via the W conductor 120 to a gas valve relay 128, where a common or return conductor or C conductor 122 serves as the return path from the gas valve relay to the transformer 14. Only the components associated with the heat or W thermostat wire and the gas valve are shown for purposes of simplicity, but it should be apparent that the same or similar arrangement as shown here could also be duplicated for controlling the fan and the compressor contactor. The power and control circuit is also omitted in this view, but would be present in any implementation of the thermostat.

In this embodiment, the electronic switching arrangement 140 is implemented employing first and second power capacitors $C_1$ and $C_2$ and first and second switching transistors $Q_1$ and $Q_2$. These switching transistors and capacitors serve as reactive elements disposed in series with the inductively reactive load. This creates two circuit legs, one formed of capacitor $C_1$ and transistor $Q_1$ and the other formed of capacitor $C_2$ and transistor $Q_2$. The capacitors are electrolytics in this embodiment, and are polarized, as shown, with capacitor $C_1$ having its positive plate connected to the thermostat power R wire, and the other capacitor $C_2$ having is negative plate connected to the R wire. The associated first switching transistor $Q_1$ has a first power electrode, e.g., collector or drain connected to the output or W connector, and the other power electrode, e.g., emitter or source, connected to the negative plate of the capacitor $C_1$. In the other leg, the second switching transistor $Q_2$ has its first power electrode, e.g., collector or drain connected with the positive plate of the second capacitor $C_2$, and has its second power electrode, e.g., emitter or source, connected with the W connector. The respective switching transistors $Q_1$ and $Q_2$ have gating electrodes that respectively receive switching signals $S_1$ and $S_2$, which are provided from the power and control circuit 30 (not shown in this view). These signal $S_1$ and $S_2$ may be generated in a microprocessor included in the thermostat electronics, so that the ON and OFF cycles of the switching transistors $Q_1$ and $Q_2$ serve to pass the thermostat power from the R conductor to the W connector and thence via the thermostat wire to the gas valve relay 128 when there is a call for heat, and serve to block passage of the thermostat power when the call for heat has been satisfied and the furnace is to be cycled off. Favorably each of the switching transistors $Q_1$ and $Q_2$ has an associated bypass diode $D_1$ and $D_2$, respectively across its power electrodes. Here the diodes have their anodes connected with the transistor source or emitter and cathode connected with the drain or collector. Other arrangements are possible depending on the selection of transistors employed.

As also shown in FIG. 2, the junctions of the capacitors $C_1$ and $C_2$ with the respective switching transistors $Q_1$ and $Q_2$ serve as the positive and negative DC power terminals and can supply DC power through a voltage regulator device 144 to the control circuitry (not shown). Here, the DC source is neither in series nor in parallel with the two associated switching transistors $Q_1$ and $Q_2$. During a call for heating or cooling, the two capacitors will be at different voltage levels at different times during each AC cycle, and the power-stealing switching arrangement is able to supply a sufficient amount of DC current. When there is no call for heat (or cooling) the switch transistors $Q_1$ and $Q_2$ are held OFF and the electric current and voltage stored on the capacitors $C_1$ and $C_2$ is available to supply the required DC power. The on/off cycling of the two transistors $Q_1$ and $Q_2$ is controlled by selecting the frequency and duty cycle of the control signals $S_1$ and $S_2$ so that there is reliable operation of the associated load coil, i.e., gas valve relay 128, and sufficient DC power for the thermostat electronics.

The operation of the power-stealing feature of this thermostat can be explained with reference to the wave-form charts of FIGS. 3A to 3J.

Figure 3A:
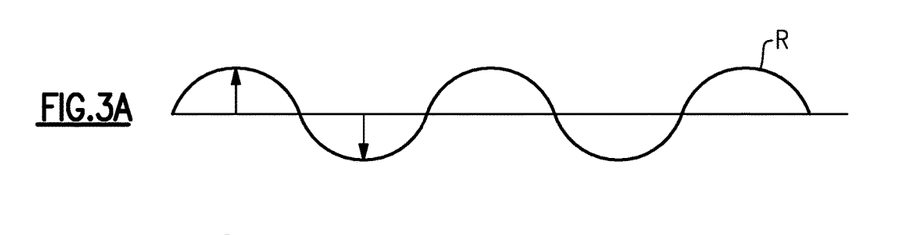

FIG. 3A shows the generally sinusoidal waveform of the thermostat power as it appears on the R wire, at an RMS voltage amplitude of 24 volts, and at a frequency of 60 Hz. Here vertical lines appear through the positive-going and negative-going zero crossings for the purpose of comparing with timing of other signals and waveforms in the chart.

Figure 3B:
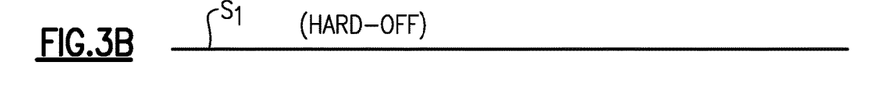
Figure 3C:
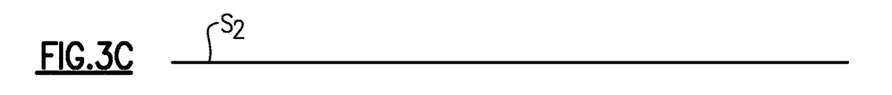
Figure 3D:
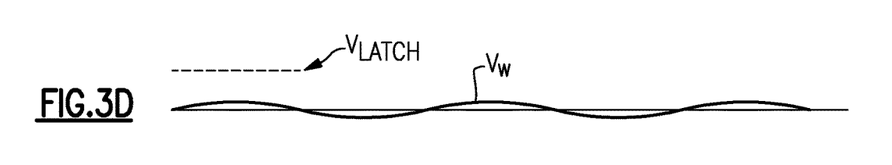

FIGS. 3B and 3C illustrate waveforms for the control signal $S_1$ and $S_2$ during the periods where the thermostat is not issuing a call for heat (or a call for cooling). In this example, the control signals $S_1$ and $S_2$ are flat or hard-OFF. The two switching transistor $Q_1$ and $Q_2$ do not conduct. The capacitors $C_1$ and $C_2$ each charge up though their respective diodes $D_1$ and $D_2$ and do not discharge, except to provide DC. The charge stored on the lower plates of the capacitors $C_1$ and $C_2$ respectively provide positive and negative voltage for the control and switch electronics for the thermostat, favorably regulated to a voltage $V_d$. At this time, the AC voltage supplied to the W contact (and from the to the gas valve relay coil 128) is essentially zero, except for a very small ripple due to the DC current draw between the two capacitors $C_1$ and $C_2$. In this state, the AC voltage $V_w$ is far too low to pull in the gas valve relay, and remains well below the required latch voltage $V_{LATCH}$, as is illustrated symbolically in FIG. 3D.

Figure 3F:
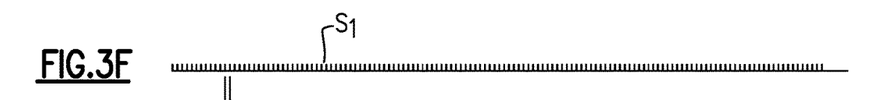
Figure 3G:
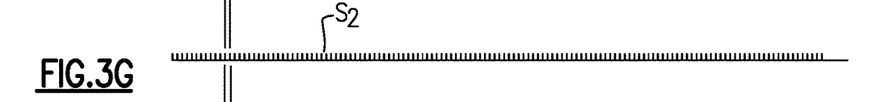
Figure 3H:
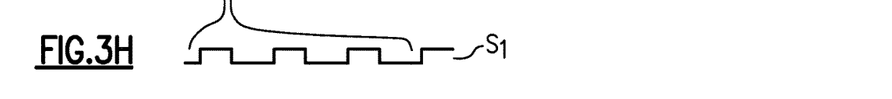

When a call for heat occurs, the control circuitry of the thermostat puts out pulsating gating signals S1 and S2 as shown in FIGS. 3F and 3G, corresponding portions of which are shown on an enlarged time axis in FIGS. 3H and 3I, respectively. In this embodiment, the signals are applied as rectangular pulses each with a duty cycle of about 48% (this can be varied, but is favorably between 40% and 48%) and at a frequency of about 20 KHz, so that there are multiple switching pulses for each cycle of the input AC power wave. Here, the two signals $S_1$ and $S_2$ are exactly alternate, so that the transistors $Q_1$ and $Q_2$ are never both conducting at the same time. This scheme allows the capacitors $C_1$ and $C_2$ to charge partially and discharge partially many times during each cycle of the input AC thermostat power wave (FIG. 3A).

The resulting power wave $V_w$ as appears on the W contact (See FIG. 3J) consists of the input 24-volt, 60 Hz thermostat power waveform with positive and negative voltage pulses or spikes superimposed on it. This gives the waveform a peak voltage value that can exceed that of the input AC power waveform, and can easily hold the gas valve relay closed, even when there is a significant DC power draw (for example, when power is needed for wi-fi). The waveform $V_w$ as appears in FIG. 3J is phase-shifted an amount $\Delta\Phi$ ahead of the input power wave.

Figure 4:
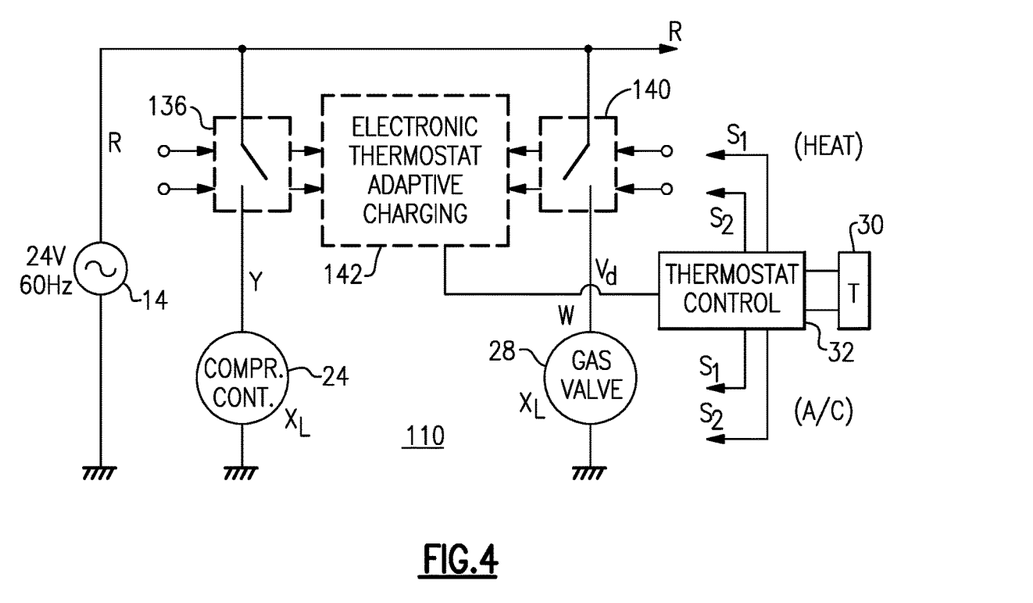
FIG. 4 is another schematic circuit diagram for explaining this embodiment.

A generalized diagrammatic representation of a thermostat with power-stealing according to an embodiment of this invention appears in FIG. 4 wherein the capacitor/switching transistor arrangements as discussed just above are employed as a controlled switch arrangement 136 for controlling connection of the R conductor to a Y conductor to supply the relay contactor 24, and another controlled switch arrangement 140 of that design makes a controlled connection of the R conductor with the W conductor to supply the gas valve relay 28. The contactor 24 and the gas valve relay 28 each appear as an inductive load, imposing a respective inductive reactance $X_L$ to the AC thermostat power. The associated switching arrangements are capacitive in nature. The internal switched current through the power capacitors (e.g., $C_1$ and $C_2$ of FIG. 2) for each of the controlled switch arrangements 136 and 140 provide a useful AC voltage differential at the junctions with their respective switching transistor, and these are fed to an rectifier or other AD/DC converter, as discussed earlier. This arrangement is represented in this diagram as an electronic thermostat adaptive charging functionality 142, which provides a sufficient charging current at a DC battery level $V_d$, to supply the thermostat control circuit 30. The control circuit, to which a temperature signal is supplied from the temperature sensor 32, then generates switching signals $S_1$ and $S_2$ for each of the controlled switch arrangements 136 and 140. Due to the capacitive nature of each of the switched arrangements 136 and 140, there is a combined L-C inductive load imposed on the thermostat power loops through each of the compressor contactor 124 and the gas valve 128. The result of this is shown, using the example of the gas valve. A portion of the electrical energy in the controlled switch arrangement 140 is diverted and used to create DC power for the thermostat, as discussed above.

Figure 5:
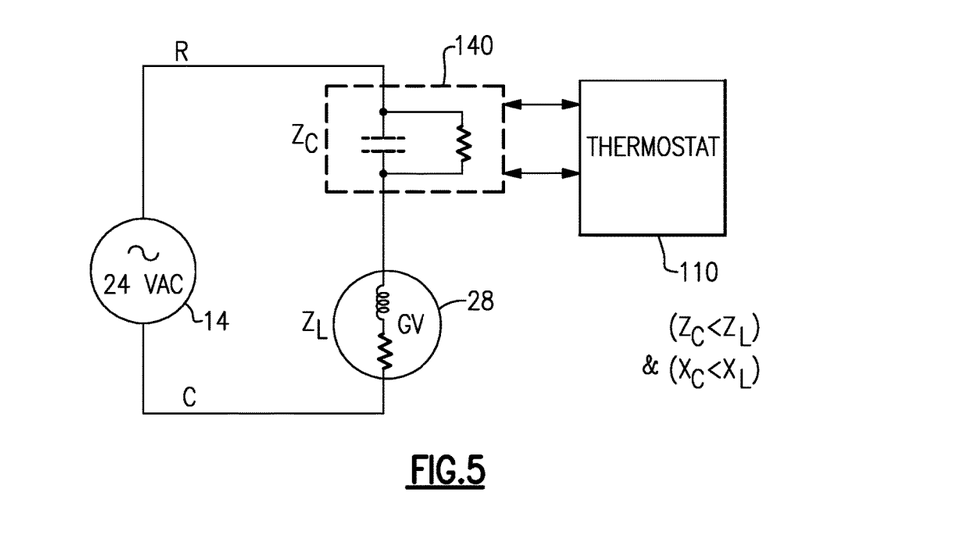
FIG. 5 is a diagram for explaining electrical behavior of the power-stealing DC power supply of this invention.

In the circuit, as diagramed in FIG. 5, the switch arrangement 140 appears as a capacitive load, with an impedance $Z_C$, while the gas valve relay 28 appears as an inductive load in series with it, with an inductive impedance $Z_L$. The AC voltage across the impedance $Z_C$ of the switch arrangement will lag the thermostat AC current in phase, while the voltage across the impedance $Z_L$ of the gas valve relay 28 leads the AC current in phase. In this design the capacitive impedance $Z_C$ is smaller than the inductive impedance $Z_L$ of the gas valve relay. This means that load voltage for the gas valve relay 28 is pushed out of phase with the current, and there is a significant voltage vector that is at quadrature with the applied voltage vector. This out-of-phase voltage creates reduced power factor so that some of the AC energy of the load-inductance power creates reflected power. However, in the power-stealing arrangement of this invention, a portion of this out-of-phase voltage is used to create the DC power for the thermostat electronic controls, which reduces the wasted reflected power wave. That is, the reflected energy is integrated in the power supply, and the integrated reflected power is available to power the logic and/or the load.

The invention has been described above with reference to a thermostat used for controlling a furnace, heat pump, air conditioner or other HVAC equipment. However, the invention has applications beyond thermostats, and can be applied to advantage in other environments where a control mechanism is coupled or connected in line with a reactive load, which could for example be the armature of an AC induction motor.

Figure 6:
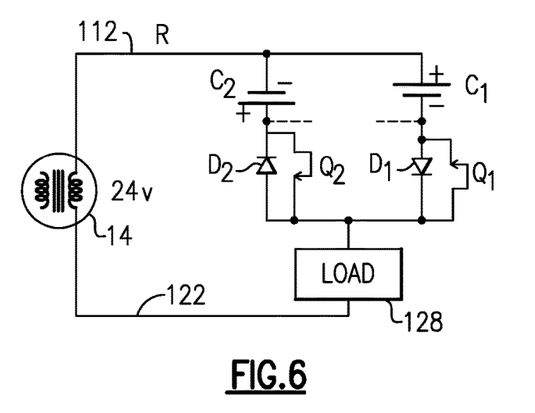
FIGS. 6, 7 and 8 are basic circuit diagrams of functionally equivalent arrangements of the switching transistors and power capacitors that may be employed in embodiments of this invention.

The switching arrangement and power-stealing feature of this invention can be arranged with the power capacitors $C_1$ and $C_2$, switching transistors $Q_1$ and $Q_2$, and bypass diodes $D_1$ and $D_2$ in several ways that are functionally equivalent. For example, as shown in FIG. 6, the capacitors $C_1$ and $C_2$ can have an electrode each connected with the power or R wire 112 of the thermostat power, with the switching transistors $Q_1$ and $Q_2$ having a main power electrode connected with the load 128 (e.g., gas valve relay), and with a return wire passing from the load 128 back to the thermostat transformer 14, as has been previously described and discussed.

Figure 7:
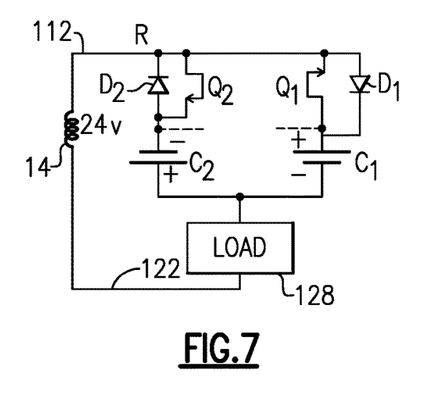
Figure 8:
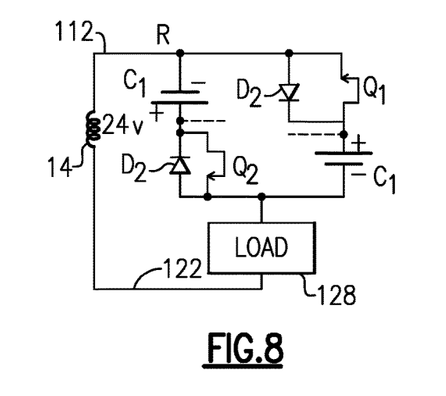

Alternatively, as shown in FIG. 7, the switching transistors $Q_1$ and $Q_2$ can have power electrodes connected with the power or R wire, and the power capacitors $C_1$ and $C_2$ can have a terminal or electrode connected with the load. As another alternative, as shown in FIG. 8, in one leg the power capacitor $C_2$ can be connected with the R or power wire 112 and the associated switching transistor $Q_2$ connected to the load 128, while in the other leg the switching transistor $Q_1$ has a main electrode connected to the power wire 122 and the associated power transistor $C_1$ has one electrode connected with the load 128. In each of these arrangements, an associated DC power supply may be fed by connecting its inputs respectively to the junction of capacitor $C_1$ switching transistor $Q_1$ and the junction of capacitor $C_2$ and switching transistor $Q_2$.

While the invention has been described with reference to selected preferred embodiments, the invention is not limited to those described embodiments; rather many variations of these would present themselves to persons skilled in the art without departing from the scope and spirit of this invention, as defined in the appended claims.

We claim:

1. An in-line control device connected in series with a load device which has a load that is at least partly reactive; and having a power terminal connected to one side of a source of AC power, a connector terminal connected to said load device, and said load device having a return power terminal connected to a second side of said source of AC power; said control device having a switching arrangement connected between the power terminal and the connector terminal for switching the load device on and off, and control circuitry within the in-line control device to provide a gating signal to said switching arrangement for commanding the switching arrangement to supply said AC power to said load device or to shut off the AC power from said load device; and wherein said switching arrangement includes:
   an electronic switch having a main electrode, a switched electrode, and a gating electrode; the main electrode and switched electrode being connected in series with the AC power and load, the gating electrode receiving said gating signals to apply AC power to said load and to disconnect the AC power from said load, respectively;
   the control circuitry being coupled to a sensing element to supply said gating signals of one sense to commence the supply of said AC power to said load device, and to supply said gating signals of a second sense to end said supply of said AC power to said load device; and wherein said electronic switch includes
      first and second power capacitors each having a first electrode and a second electrode;
      first and second electronic switching devices, each corresponding to a respective one of the first and second power capacitors and having a first power electrode, a second power electrode and a gate, the power electrodes of each switching device being connected, at a respective junction, in series with the corresponding power capacitor defining respective serial combinations;
      the serial combinations being connected to each other in parallel in a parallel combination connected with the AC power and load in series; and wherein
   said control circuitry includes outputs providing respective periodic gating signals to the gates of said first and second switching devices, respectively, said gating signals having said one sense when the sensor senses a condition for commencing a supply of AC power to said load device, and having said second sense when the sensor senses a condition for terminating the supply of AC power to said load device; and
   wherein
      said control circuitry within the in-line control device has power inputs connected to the respective junctions between the power capacitors and switching devices, such that the power capacitors provide a power-stealing DC supply for said control circuitry without interfering with the supply of AC power and termination of supply of AC power to the load device.

2. The in-line control device according to claim 1, wherein said first and second electronic switching devices each include a bypass diode connected between the first power electrode and the second power electrode thereof.

3. The in-line control device according to claim 2, wherein said bypass diodes each have an anode connected to the first power electrode of the associated switching device and a cathode connected to the second power electrode thereof.

4. The in-line control device according to claim 1, wherein the gating signals of said one sense have a waveform with a duty cycle that is substantially greater than the duty cycle of the gating signals of said second sense.

5. The in-line control device according to claim 1 wherein said gating signals are provided as rectangular pulses at a frequency such that there are multiple pulses for each cycle of the input AC power wave.

6. The in-line control device according to claim 1, wherein said DC powered circuit mechanism includes charge storage means for maintaining said DC supply voltage.

7. An in-line control device connected in series with a load device which has a load that is at least partly reactive; and having a power terminal connected to one side of a source of AC power, a connector terminal connected to said load device, and said load device having a return power terminal connected to a second side of said source of AC power; said control device having a switching arrangement connected between the power terminal and the connector terminal for switching the load device on and off, and a DC powered control mechanism within the in-line control device for providing gating signal to said switching arrangement for commanding the switching arrangement to supply said AC power to said load device or to shut off the AC power from said load device; and wherein said switching arrangement includes:
   electronic switch means having a main electrode coupled to said power terminal; a switched electrode connected to said connector terminal; and a gating electrode receiving said gating signals to apply AC power to said load and to disconnect the AC power from said load, respectively;
   the control mechanism being coupled to a sensor element to supply said gating signals of one sense to commence the supply of said AC power to said load device, and to supply said gating signals of a second sense to end said supply of said AC power to said load device; and wherein:
   said electronic switching means includes
      first and second power capacitors each having a first electrode and a second electrode, and first and second electronic switching devices, each having a first main electrode, a second main electrode and a gate, with one of the first and second main electrode of each of the first and second switching devices being connected to one of the first and second electrodes on an associated one of the first and second power capacitors, and with the other of the first and second electrodes of the first and second power capacitors and the other of the first and second main electrodes of the first and second switching devices being connected in series between said power terminal and said load; wherein said control mechanism includes outputs providing respective periodic gating signals to the gates of said first and second switching devices, respectively, said gating signals having said one sense when the sensor element senses a condition for commencing a supply of AC power to said load device, and having said second sense when the sensor senses a condition for terminating the supply of AC power to said load device; and wherein said DC powered control mechanism has positive and negative power inputs connected respectively to said one of the first and second electrodes of the first power capacitor that is connected with said one main electrode of the first switching device, and to said one electrode of the second power capacitor that is connected with said one main electrode of the second switching device, such that either one or both of said power capacitors provide a power-stealing DC supply for said DC powered circuit mechanism without interfering with the supply of AC power nor with termination of supply of AC power to the load device.

8. The in-line control device according to claim 7, wherein said first and second electronic switching devices each include a bypass diode connected between the first power electrode and the second power electrode thereof.

9. The in-line control device according to claim 8, wherein said bypass diodes each have an anode connected to the first power electrode of the associated switching device and a cathode connected to the second power electrode thereof.

10. The in-line control device according to claim 7, wherein the gating signals of said one sense have a waveform with a predetermined duty cycle.

11. The in-line control device according to claim 7 wherein said gating signals are provided as rectangular pulses at a frequency such that there are multiple pulses for each cycle of the input AC power wave.

12. The in-line control device according to claim 7, wherein said DC powered circuit mechanism includes charge storage means for maintaining said DC supply voltage.

13. Power-stealing wall thermostat coupled by a run of thermostat wires to a comfort air apparatus that provides heated or cooled air to a comfort space when the thermostat issues a call for heat or cooling based on the temperature of air in said comfort space and to shut down the comfort air apparatus when the thermostat determines that the call for heat or cooling has been satisfied, and which has a main thermostat power connector to connect to a predetermined one of the thermostat conductors to receive AC thermostat power, and at least one controlled output connector that provides switched AC thermostat power to one or more wires of said thermostat wires to cycle the comfort air apparatus when there is a call for heat or cooling and to end the cycle of said comfort air apparatus when the call for heat or cooling has been satisfied; and including:

electronic switch means having a main electrode coupled to said main thermostat power connector and a switched electrode connected to said controlled output connector to cycle said comfort air apparatus on and to cycle said apparatus off;

electronic thermostat control arrangement including a temperature sensing element sensitive to the temperature in said comfort space, and control circuitry coupled to said temperature sensing element to issue a call for heat or cooling when a predetermined temperature setpoint is reached, and to end said call for heat when said call for heat or cooling is satisfied; and a power-stealing power supply coupled to said electronic switch means for obtaining a portion of said AC thermostat power and supplying DC power to said electronic thermostat control arrangement;

comprising the improvement wherein:

said electronic switching means includes first and second power capacitors each having a first electrode and a second electrode, and first and second electronic switching devices, each having a first main electrode, a second main electrode and a gate, with one of the first and second main electrodes of each of the first and second switching devices being connected to one of the first and second electrodes of an associated one of said first and second power capacitors, and the other of the first and second electrodes of the first and second power capacitors and the other of the first and second main electrodes of the first and second switching devices being connected in series between said power terminal and said load; wherein said control circuitry includes outputs providing respective periodic gating signals to the gates of said first and second switching devices, respectively, said gating signals having a first waveform when the thermostat control arrangement issues a call for heat or cooling, and have a second waveform when the call for heating or cooling is satisfied; and wherein first and second inputs to said power supply are coupled to respective junctions of the first power capacitor with the associated first switching device and of the second power capacitor with the associated second switching device.

14. The thermostat according to claim 13, wherein said first and second electronic switching devices each include a bypass diode connected between the first power electrode and the second power electrode thereof.

15. The thermostat according to claim 14, wherein said bypass diodes each have an anode connected to the first power electrode of the associated switching device and a cathode connected to the second power electrode thereof.

16. The thermostat according to claim 13, wherein the first waveform of said gating signals has a predetermined duty cycle.

17. The thermostat according to claim 13, wherein said gating signals are provided as rectangular pulses at a frequency such that there are multiple pulses for each cycle of the input AC thermostat power.

18. The thermostat according to claim 13, wherein said run of thermostat wires lacks a common return wire for directly coupling said thermostat to a return of said thermostat power, and wherein said power-stealing power supply is configured to obtain said portion of AC thermostat power only from said electronic switching means.

19. The thermostat according to claim 13, wherein said power supply includes charge storage means for maintaining a DC output voltage to supply said electronic thermostat control arrangement.

20. An in-line control device with power-stealing comprising capacitor/switching transistor arrangements that are employed as a controlled switch arrangement for controlling connection of an input power conductor bearing AC input power to a conductor to supply an inductive contactor device which appears as an inductive load imposing a respective inductive reactance $X_L$; wherein the associated switching arrangements are capacitive in nature, having a capacitive reactance of $X_C$; wherein the capacitor/switching transistor arrangements each comprise a pair of power capacitors $C_1$ and $C_2$ in series with respective switching transistors $Q_1$ and $Q_2$, the power capacitors $C_1$ and $C_2$ being arranged to charge positively and negatively, respectively, thus to provide a useful AC voltage differential at junctions with their respective switching transistor;

a control circuit including a sensor sensitive to an environmental change and a signal generating circuit that generates switching signals to be applied to each of the capacitor/switching transistor arrangements; and means providing said AC voltage differential as an adaptive DC source for powering said control circuit.

21. The in-line control device with power-stealing according to claim 20, wherein are said signal generating circuit generates switching signals as rectangular pulses at a frequency such that there are multiple pulses for each cycle of the AC input power.

22. The two-wire control device with power-stealing according to claim 21 wherein said switching signals are provided with a duty cycle of between 40% and 48%.

23. The two-wire control device with power-stealing according to claim 20, wherein said means providing said AC voltage differential to said control circuit includes a voltage regulator having inputs connected to said power capacitors and an output providing a controlled DC voltage $V_d$ to said control circuit.

24. The two-wire control device with power-stealing according to claim 20, wherein the capacitor/switching transistor switching arrangements in series with the associated inductive contactor device define a combined L-C inductive load imposed on the AC input power; and wherein the capacitive impedance $Z_C$ is smaller than the inductive impedance $Z_L$.

25. A control device for regulating application of AC power from an AC power source to a load that is at least partly reactive, and for diverting at least a portion of the AC power to power a device other than said load, the control device comprising:

an energy storage and switching arrangement that is at least partly reactive and is adapted to form with said load an L-C circuit powered by the AC power when the energy storage and switching unit is connected to the load and the AC power source;

an electronic switch disposed in circuit between the energy storage arrangement and the load and adapted for switchably connecting the energy storage and switching unit to the AC power and the load;

a gating circuit connected to a gating input of the electronic switch and adapted to cause the electronic switch to close and open in a time sequence relative to a waveform of the AC power, and adapted to generate at a junction between the energy storage device and the electronic switch a voltage having a value that depends on an attribute of said time sequence; and a power supply having an input and an output, the input being connected to receive the voltage appearing at the junction between the energy storage device and said electronic switch, with said output being adapted to supply an altered form of said voltage to said device other than said load.

26. The control device of claim 25, wherein said energy storage device comprises at least one capacitor.

27. The control device of claim 26, wherein the energy storage device comprises a first capacitor and a second capacitor; wherein the electronic switch comprises a first switching device and a second switching device, each said switching device comprising a main electrode and a switched electrode connected in series with a corresponding on of the first and second capacitors, and a gate electrode connected to said gating circuit and controlled by respective gating signals from said gating circuit to permit and interrupt current flow across the main and switched electrodes of said first and second switching devices; and wherein the input of the power supply is connected to receive a differential voltage appearing between a first junction, which is between the first switching device and the first capacitor, and a second junction, which is between the second switching device and the second capacitor.

28. The control device of claim 27, wherein said power supply comprises a converter adapted to provide a direct current at an output thereof.

* * * * *